(12) United States Patent
Oozeki et al.

(10) Patent No.: US 6,864,511 B2
(45) Date of Patent: Mar. 8, 2005

(54) OPTICAL TRANSMISSION MODULE AND THE PRODUCTION METHOD OF THE SAME

(75) Inventors: Yoshio Oozeki, Ebina (JP); Kazumi Kawamoto, Yokohama (JP); Seiichi Tsuchida, Yokosuka (JP)

(73) Assignee: OpNext Japan, Inc., Yokohama (JP)

( * ) Notice: Subject to any disclaimer, the term of this patent is extended or adjusted under 35 U.S.C. 154(b) by 302 days.

(21) Appl. No.: 10/222,288

(22) Filed: Aug. 16, 2002

(65) Prior Publication Data

US 2003/0152119 A1 Aug. 14, 2003

(30) Foreign Application Priority Data

Feb. 12, 2002 (JP) ........................................ 2002-033498

(51) Int. Cl.⁷ .............................................. H01L 27/15
(52) U.S. Cl. ............................ 257/84; 257/13; 257/22; 257/81; 257/94; 257/184; 257/431; 257/432
(58) Field of Search ............................... 257/13, 22, 81, 257/84, 94, 184, 431, 432

(56) References Cited

U.S. PATENT DOCUMENTS 6,514,782 B1 * 2/2003 Wierer et al. .................. 438/22
6,556,606 B2 * 4/2003 Takayama et al. ............ 372/46

* cited by examiner

*Primary Examiner*—Long Pham
*Assistant Examiner*—Wai-Sing Louie
(74) *Attorney, Agent, or Firm*—Townsend and Townsend and Crew LLP

(57) ABSTRACT

An optical transmission module with an optical device mounted in a substrate provided with an optical waveguide is provided wherein respective metallic electrodes in pair are symmetrically disposed in each side of an optical device divided by a centerline parallel to an optical axis such that those electrodes have an error of 60 μm or less and said metallic electrodes are soldered to a metallic electrode as disposed on a substrate, which electrode has a size enough to cover those electrodes as disposed in the optical device.

14 Claims, 7 Drawing Sheets

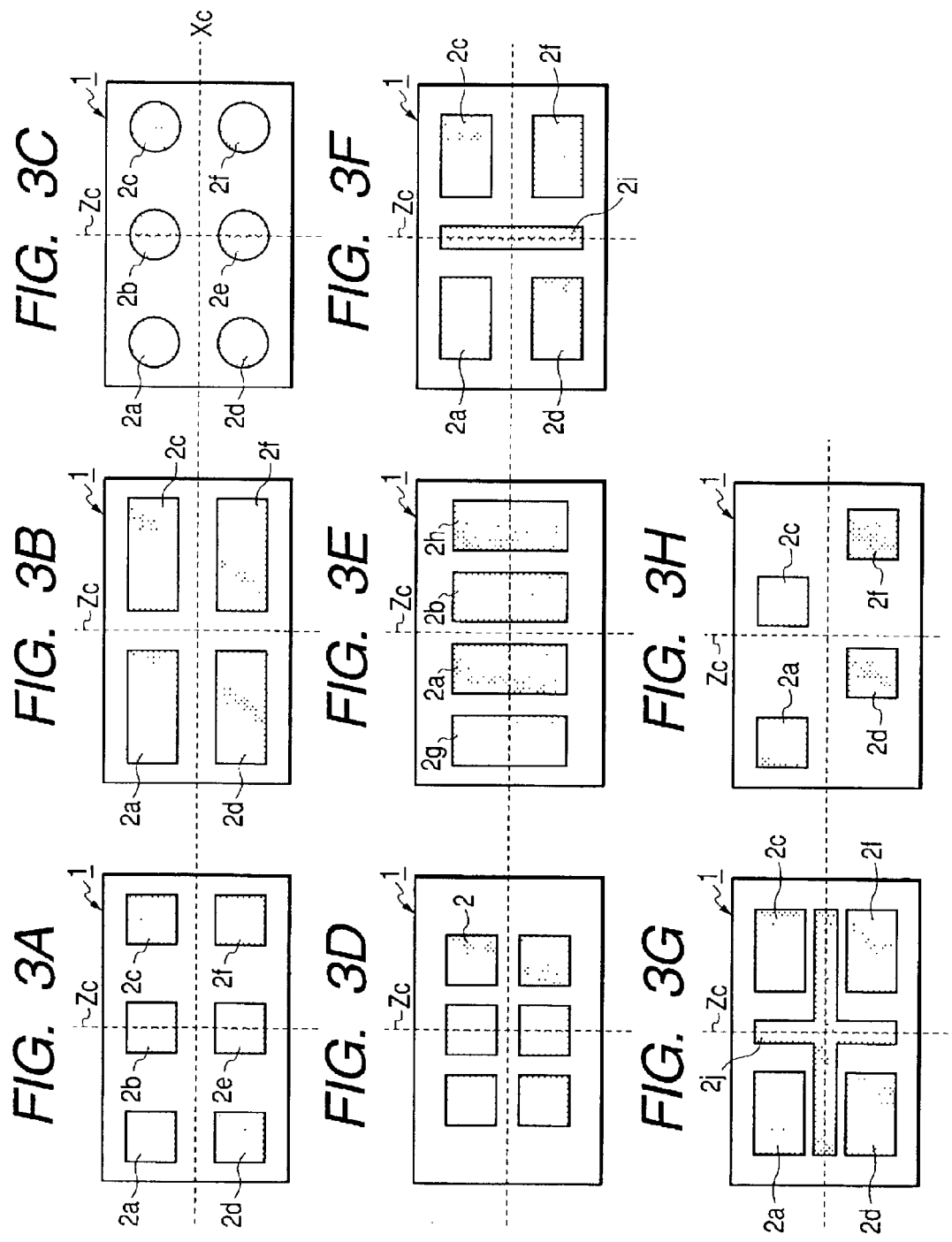

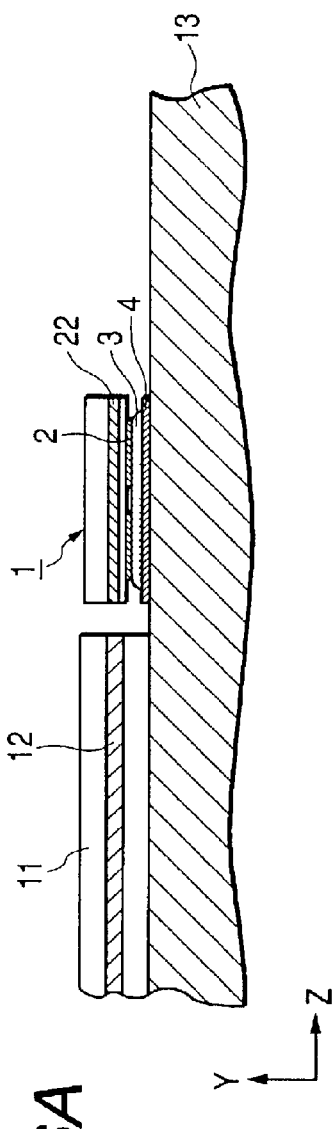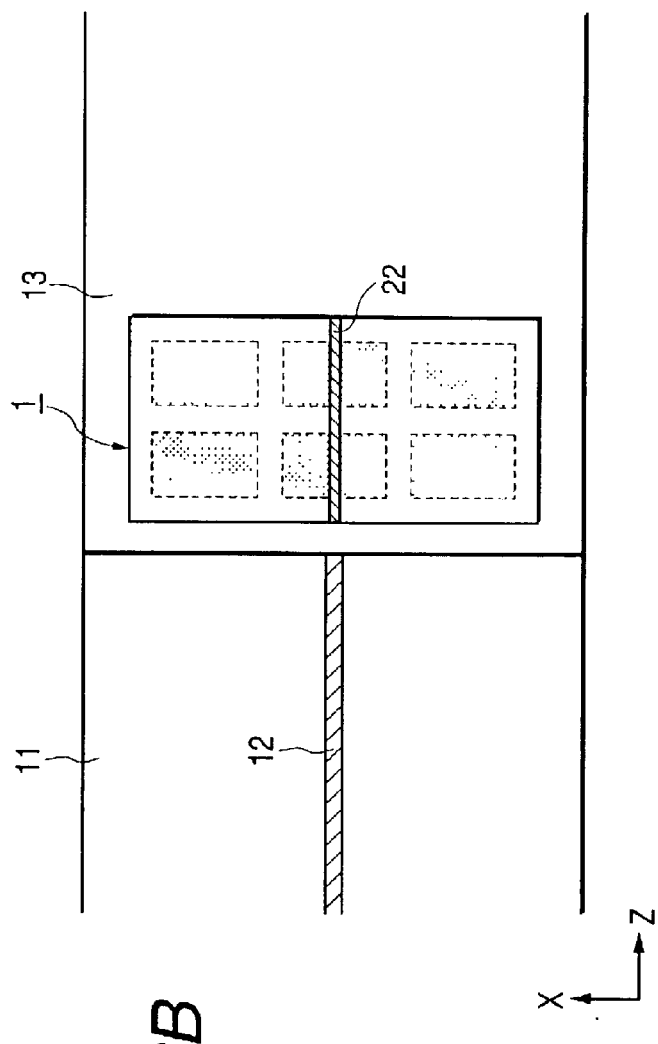
FIG. 6A
FIG. 6B

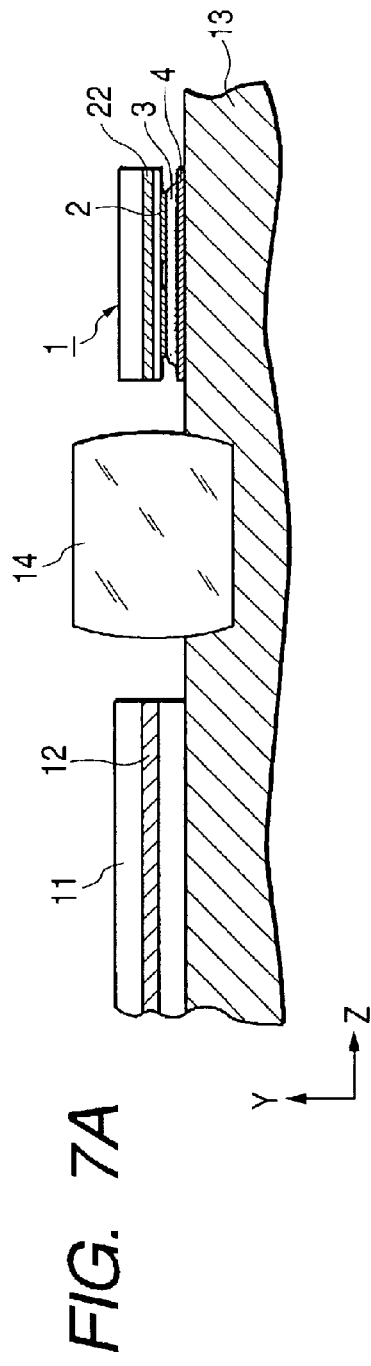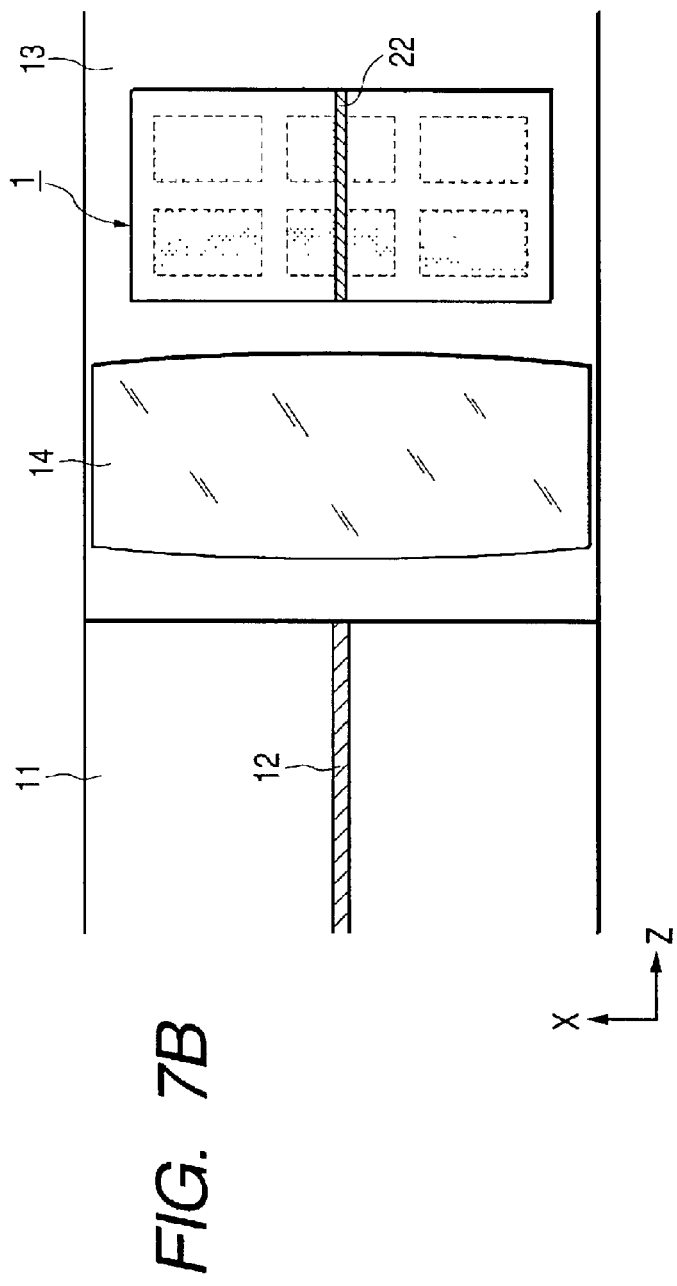

OPTICAL TRANSMISSION MODULE AND THE PRODUCTION METHOD OF THE SAME

FIELD OF THE INVENTION

The present invention relates to an optical transmission module, especially, pertaining to such module as an optical device being mounted therein and the production method thereof.

DESCRIPTION OF THE RELATED ART

When the optical device is mounted in the optical transmission module, it is positioned such that the optical axis of the device corresponds to an optical waveguide so as to secure a better optical coupling between the optical axis and the optical waveguide formed on a substrate. The optical device is generally positioned on the optical transmission module by soldering, in which the optical axis of the optical device must align with the optical waveguide.

Conventionally, a method for jointing the optical device with the substrate according to the above arrangement is known as (1) comprising the steps of forming the sole larger metallic electrode between the substrate and the optical device and jointing them by soldering or as (2) comprising the steps of forming the plurality of separate electrodes on the optical device and the substrate respectively and jointing them together in a self-alignment manner. One example of the above (2) is disclosed in Japanese Patent Laid-open No. H10-190187, wherein the optical device and the substrate are vertically positioned through the electrodes as disposed such that they make a cross-shape interstice and soldered together in a self-alignment manner.

SUMMARY OF THE INVENTION

However, as to the above (1),
(a) the oxide film on the solder surface is not ruptured so quick as required for constraining the optical device and the substrate from being relatively displaced because of a weaker pressure as applied to the unit area of the respective electrodes.
(b) in case that the metallic electrode of the optical device is provided one for each optical device, the oxide film rupture points on the soldered surface is very few, so that the length of wetted and spread the fused solder becomes long in the meantime the optical device is displaced from the substrate to large extent. Therefore, the optical coupling between the optical device and the waveguide is deteriorated.

As to the above (2), there is no problem in the aspect of the rupture of the oxide film and the wettability of the fused solder, but it requires to correspond or resemble the electrode shape of the optical device to that of the substrate in order to secure the self-alignment between the optical device and the substrate, which obliges the shape of the respective electrodes to be accurately produced. Further, it is required that the electrodes be positioned in alignment in addition to the positioning of the optical device such that its optical axis aligns with the waveguide, which complicates the production process of the optical transmission module and raises the production cost thereof.

The present invention is to provide an optical transmission module wherein an optical device is mounted in a substrate with an optical waveguide provided thereon in a cost-saving and precise manner.

Where an optical transmission module is produced by soldering an optical device and a substrate through the respective metallic electrodes thereof, such optical device is adopted as being provided with metallic electrodes as disposed in a region thereof corresponding to the metallic electrode of the substrate, which metallic electrodes are symmetrically disposed through a center line passing through the center of gravity (or the dimensional center which is almost similar to position with the center of gravity, therefore, the dimensional center can be applied in the invention, and hereinafter, the center of gravity or the dimensional center merely called the center of gravity) of the optical device and running parallel to the optical axis thereof or the optical axis.

This linear symmetry allows for displacement in the order of 50 $\mu$m in the respective sides of the optical device as divided by the optical axis or the centerline, so that an optical device is adopted wherein the metallic electrodes are disposed such that the difference between the shortest distances from the center of gravity or the center of the respective symmetrically disposed electrodes to the centerline or the optical axis amounts to 100 $\mu$m or less.

Further, the higher optical coupling is required for a long-distance transmission wherein the linear symmetry allows for displacement of 30 $\mu$m in the respective sides of the optical device as divided by the optical axis, so that an optical device is adopted wherein the metallic electrodes are disposed such that the difference between the shortest distances from the center of the respective symmetrically disposed electrodes to the optical axis amounts to 60 $\mu$m or less.

The above arrangement is one example to show the interrelation between two electrodes of the optical device and the substrate, where more electrodes are disposed therein, the shortest distances from the respective electrodes to the optical axis, the centerline or a normal line with regard thereto are summed up in the respective sides of the optical deice and the difference between the total distance of the respective side thereof is arranged to amount to 30 $\mu$m multiplied by the number of the electrodes or less, which allows the optical device to be horizontally and vertically positioned relative to the substrate in an accurate manner so as to improve the optical coupling of the transmission module.

These and other objects, features and advantages of the invention will be apparent from the following more particular description of preferred embodiments of the invention, as illustrated in the accompanying drawings.

BRIEF DESCRIPTION OF THE DRAWINGS

FIGS. 3A to 3H are plan views to show another example of the metallic electrodes as disposed on the optical device according to the present invention.

FIG. 6A is a partly sectional view of one example of the optical transmission module according to the present invention, and FIG. 6B is an upper surface view thereof.

FIG. 7A is a partly sectional view of one example of the optical transmission module according to the present invention, and FIG. 7B is an upper surface view thereof.

BEST MODE FOR CARRYING OUT THE INVENTION

Hereinafter, the preferred embodiments of the present invention are described with reference to the accompanying drawings.

Figure 1A:
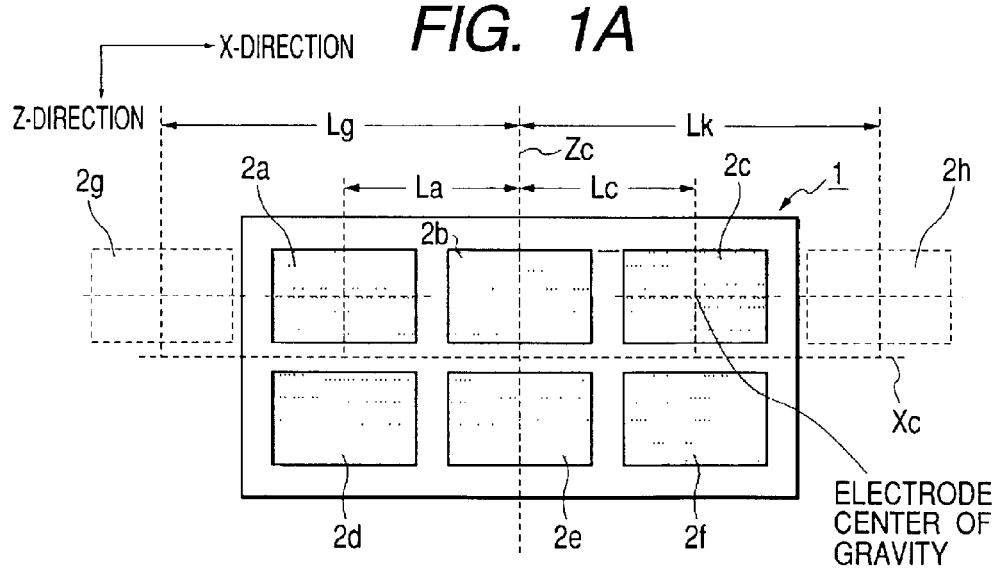
FIG. 1A is a view to show the lower surface of an optical device according to the present invention.
Figure 1B:
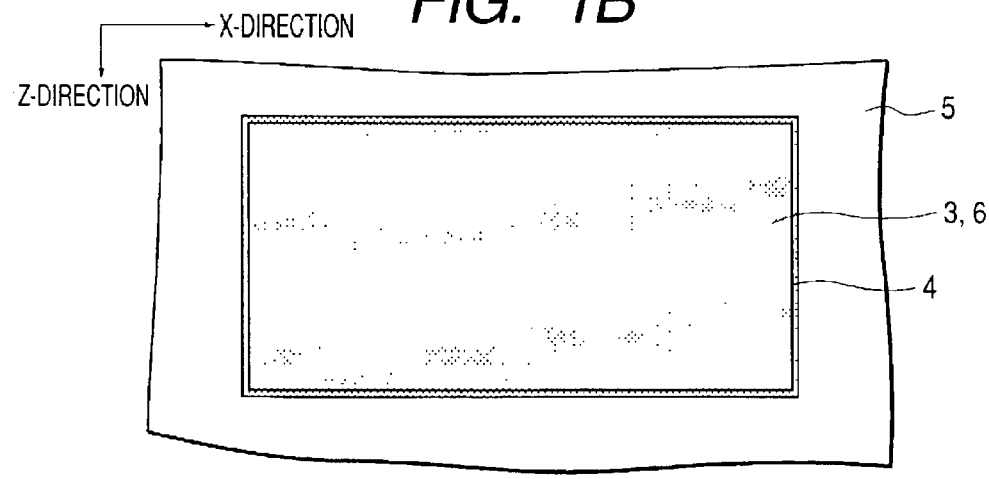
FIG. 1B is a view to show the upper surface of a substrate according to the present invention.
Figure 1C:
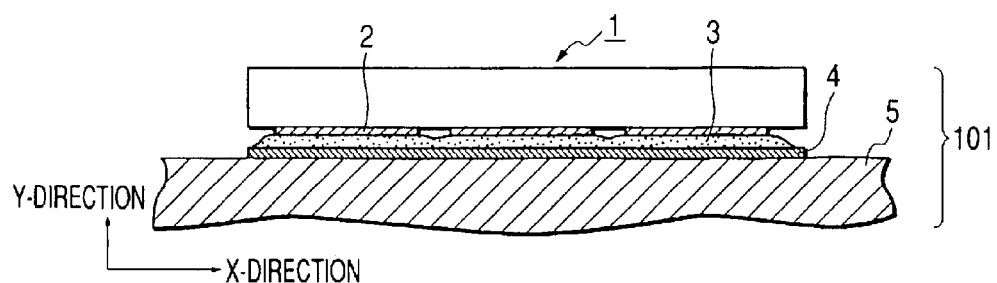
FIG. 1C is a partly sectional view of an optical transmission module with the optical device as shown in FIG. 1A soldered to the substrate as shown in FIG. 1B.

FIG. 1A is a lower surface view of one example of the optical device according to the present invention, and FIG. 1B is an upper surface view of a substrate 5 made of silicone while FIG. 1C is a partly sectional view of an optical transmission module with the optical device as shown in FIG. 1A soldered to the substrate 5.

As shown in FIG. 1A, six metallic electrodes 2a to 2f respectively made of any one of at least Ti, Pt, Au are disposed on the lower surface of an optical device 1 as adopted for the optical transmission module according to the present embodiment Herein, a line Zc passes through a center of gravity of the optical device 1 and extends in the Z-direction thereof, which line substantially corresponds to a line centrally crossing with the optical device in the X-direction thereof and drawn to the Z-direction thereof. The optical axis of the device 1 substantially aligns with the line Zc as shown in FIG. 1A. In other words, the line Zc substantially corresponds to the optical axis thereof, when the device 1 is produced with precision. Likewise, in FIG. 1A, a line Xc passes through the center of gravity (or the dimensional center which is almost similar position with the center of gravity, therefore, the dimensional center can be applied in the invention) the device 1 and extends in the X-direction thereof, which line substantially corresponds to a line centrally crossing with the device in the Z-direction thereof.

In the present embodiment, metallic electrodes 2a and 2c as well as 2d and 2f are symmetrically disposed through the line Zc. Provided that the shortest distance between the center of gravity of the electrode 2a and the line Zc is referred to as La and that between the center of gravity of the electrode 2c and the line Zc is referred to as Lc, it is arranged such that |La–Lc| is less than or equal to 60 μm. Likewise, assuming that the shortest distance between the center of gravity of the electrode 2d and the line Zc is referred to as Ld and that between the center of gravity of the electrode 2f and the line Zc is referred to as Lf, it is arranged such that |Ld–Lf| is less than or equal to 60 μm.

The above conditions may be also met by defining the shortest distances between the respective electrodes and the optical axis of the device 1 as La, Lc, Ld and Lf. Further, in the present embodiment, the electrodes 2a, 2b and 2c are symmetrically disposed through the line Xc with regard to the corresponding electrodes 2d, 2e and 2f. To note, the centerline of the Z-direction of the device 1 passes through the center of gravity thereof and crosses with the line Zc.

As shown in FIG. 1B, a substrate 5 of the present embodiment has a function of electrical connection with the respective electrodes 2a to 2f and that of an under bump metal (UBM) to secure wettability of solder for mechanical fixity, which substrate comprises a metallic electrode 4 formed in such a size as receiving all the plural electrodes 2a to 2f and a solder 3 of eutectic composition consisting of Au-20 Wt % Sn as disposed on the electrode 4.

The optical transmission module as shown in FIG. 1C shows the state where the electrodes 2 as shown in FIG. 1A and the electrode 4 as shown in FIG. 1B are soldered together.

Then, a method for producing the optical transmission module as shown in FIG. 1C comprising the optical device 1 as shown in FIG. 1A and the substrate 5 as shown in FIG. 1B is described below.

Firstly, the optical device 1 is mounted on the solder 3 of the substrate 5 with the former two-dimensionally positioned to the latter such that the optical axis aligns with an optical waveguide as formed on the latter, which is not shown in the drawings.

Then, the solder 3 is softened by heating the same under the temperature lower than the melting point thereof so as to make it a solder 6 in softened state, on which softened solder the optical device 1 is provisionally fixed by mechanically applying pressure thereon so as to be cut into the solder 6 in softened sate.

Finally, the softened solder is fused by heating the same under the temperature higher than the melting point thereof so as to electrically connect the optical device with the substrate as well as to mechanically fix the former to the latter without applying load thereto.

There are following merits when the optical device 1 as shown in FIG. 1A and the substrate as shown in FIG. 1B are jointed by the above method so as to produce an optical transmission module.

(1) The optical device 1 as adopted for the optical transmission module according to the present embodiment is made from compound semiconductor so that it is of small yield stress and fragile structure, so that heavy load is not applied thereto. Thus, the adoption of the optical device arranged as if the electrode 4 of the substrate 5 is divided into the electrodes 2a to 2f increases load as applied to the unit surface area of the softened solder 6, which allows the oxide film thereof to be ruptured for keeping a preferable connection between the optical device 1 and the metallic electrode 4.

(2) The larger area of the electrode reduces pressure as applied to the oxide film of the soldered surface so as to decrease the rupture points thereof. On the contrary, in the present embodiment, the subdivision of the electrode 2 into the respective electrodes 2a to 2f increases the number of the rupture points thereof and narrows an area for wetting and spreading the solder per rupture point. And the relation between the locations of the soldered surface where the oxide film is ruptured and the direction in which the solder is wetted and spread is indefinite, which has some possibility to causes the solder to be wetted in a specific direction especially when the optical device 1 has only one metallic electrode so as to be highly likely to cause the displacement of the optical device with regard to the substrate. Accordingly, the provision of the plural metallic electrodes 2a to 2f restrains the optical device from being displaced in the least degree both after and before soldering solidification with regard to the X and Z-horizontal directions thereof and a rotation angle θY in the X–Z plane surface thereof owing to the wettability of the solder. To note, 'before soldering solidification' means the state where the solder 3 is heated so as to become a softened solder 6 while 'after soldering solidification' means the state where the softened solder 6 is solidified so as to complete the soldering process.

The optical transmission module with the optical device mounted on the substrate in such a highly precise alignment as mentioned above improves optical transmission efficiency so as to extend transmission distance.

In the present embodiment, in view of an inclination angle θx in the X-direction of the optical device 1 after and before soldering solidification, the electrodes 2a and 2d are symmetrically disposed through the line Zc, which line substantially corresponds to the optical axis thereof, to the counterpart electrodes 2c and 2f wherein the shortest distance from the center (or the center of gravity) of the respective electrodes 2a and 2d as well as 2c and 2f to the line Zc is summed up in the respective sides thereof as divided by the line Zc, and the difference between the shortest distances as totaled in each side is arranged to amount 30 μm multiplied by the number of metallic electrodes or less.

The number of the metallic electrodes as referred to herein is that of the electrodes as symmetrically arranged through the line Zc in each row with the exclusion of the electrode crossing with the line Zc. Namely, in the embodiment as shown in FIG. 1A, the electrode 2a and 2c are counted with the exclusion of the electrode 2b so that the number thereof is 2. Provided that another electrode 2g is disposed to the left side of the electrode 2a and another electrode 2h is disposed to the right side of the electrode 2c, the number thereof amounts to 4. In this case, assuming that the shortest distance from the center of gravity of the respective electrodes 2g and 2h to the line Zc is Lg and Lh, those electrodes are disposed such that they satisfy the condition defined as |(La+Lg)−(Lc+Lh)| being less than or equal to 30 μm multiplied by 4.

Especially, in the arrangement as shown in FIG. 1A, the difference between the shortest distances La and Lc from the line Zc (optical axis) to the symmetrically disposed electrodes 2a and 2c or |La−Lc| as well as that between those Ld and Lf from the line Zc to the symmetrically disposed electrodes 2d and 2f or |Ld−Lf| are defined as 60 μm (30 μm multiplied by 2) or less. However, if the optical coupling efficiency may be lowered somewhat, it allows for in the order of 100 μm (50 μm multiplied by 2).

With such arrangement of the electrodes as mentioned above, where the softened solder 6 under volume dilation forces upward the respective electrodes 2a to 2f, it remarkably lessens the total bending moment as caused on the optical device 1, which restrains the device from being vertically displaced or the displacement thereof by an inclination angle θx.

Likewise, in the X-direction thereof, the electrodes 2a, 2b, 2c and 2d, 2e, 2f are symmetrically disposed through the line Xc such that the difference between the shortest distances from the respective electrodes 2a and 2d to the line Xc, that between those from the respective electrodes 2b and 2e thereto as well as that between those from the respective electrodes 2c and 2f thereto all fall within 60 μm, which restrains the optical device from being vertically displaced or the displacement thereof by an inclination angle θz in the Z-direction thereof.

Figure 2:
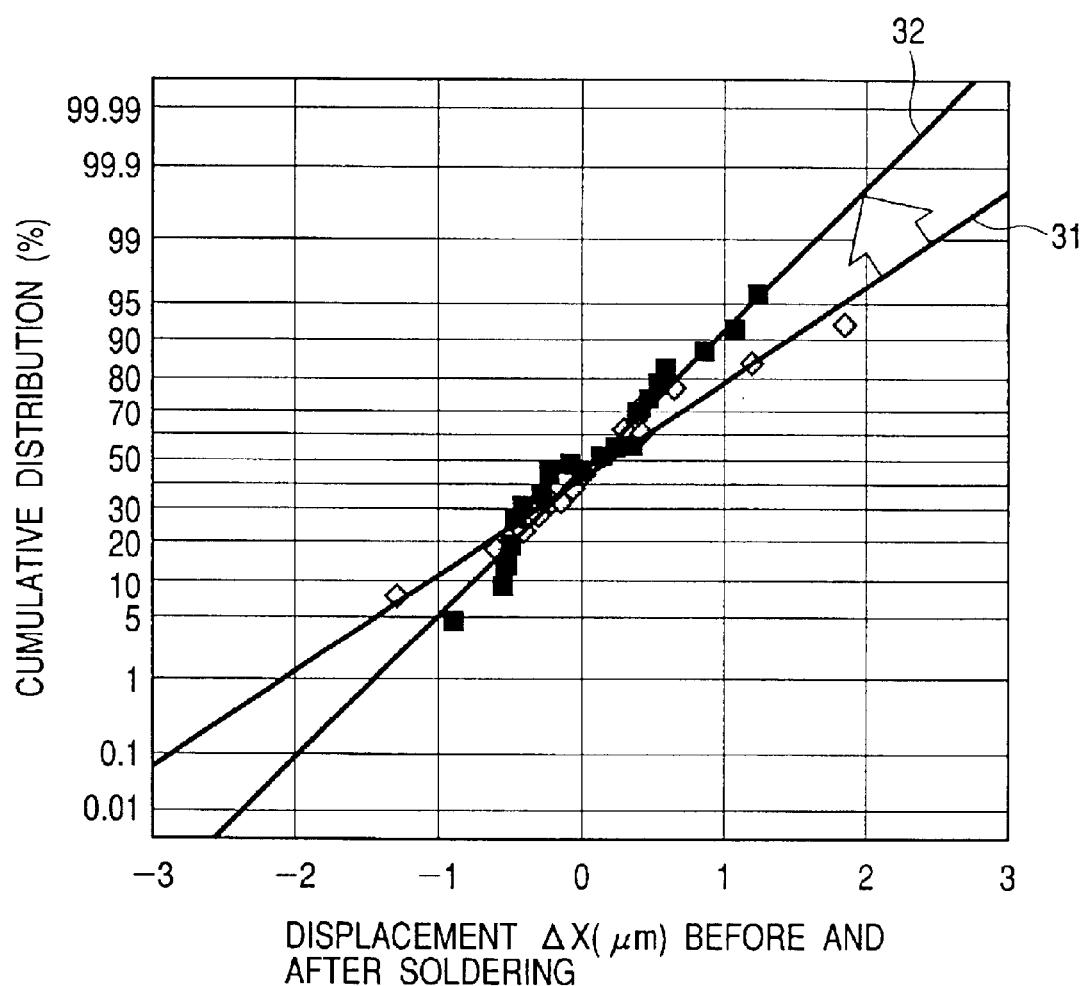
FIG. 2 is a graph to evaluate displacement after and before soldering solidification.

FIG. 2 is a graph of the relation between a cumulative distribution (%) of the optical modules as output and a displacement of the optical device in the X-direction thereof after and before soldering solidification wherein the transverse axis indicates a displacement Δx (μm) while the vertical axis indicates a cumulative distribution (%). A line 31 thereof shows the characteristic relation between them where an optical device with a metallic electrode provided on the whole surface thereof is adopted while a line 32 thereof shows that where an optical device 1 provided with the plurality of electrodes 2a to 2f is adopted in the present embodiment. Comparing the line 31 with the line 32, when the displacement Δx is 2 or less, optical transmission modules are producible by the output rate ranging from 99 to 99.9% according to the line 32, while they are producible just by the output rate of substantially 96% according to the line 31. Thus, when one sheet of metallic electrode is provided on the whole surface of the optical device, the modules yield is found to be poor. It is clear that the provision of the plural electrodes 2a to 2f on the optical device mitigates the displacement in the X-direction thereof after and before soldering solidification much better than that of the sole electrode thereon so as to realize its higher horizontal precision. Further, it is found that the adoption of the optical device provided with the plural electrodes 2a to 2f realizes higher horizontal and vertical precision also with respect to the Z-direction thereof as well as the angles θX and θY.

Further, it is confirmed that the optical device with an electrode 2 provided on the whole surface thereof causes a displacement thereof resulting from a longer time required for wetting the softened solder 6 and the vertical displacement thereof (inclination) owing to the upward force of the optical device so as to deteriorate the horizontal and vertical mounting precision thereof as to the Z-direction thereof as well as the angles θX and θY.

FIGS. 3A to 3H respectively show an example of the optical device 1 with the plurality of electrodes 2 provided thereon. In order to keep a higher mounting precision of the optical device 1 after and before soldering solidification, as shown in FIGS. 3A to 3H, the electrodes are disposed on the device such that the total bending moment amounts closer to zero with respect to the X and Z-directions of the optical device 1.

In FIG. 3A, it is shown that substantially square metallic electrodes 2a and 2c are symmetrically disposed through the line Zc and substantially square metallic electrodes 2d and 2f are symmetrically disposed through the line Zc while substantially square electrodes 2b and 2e are disposed on the line Zc. In FIG. 3B, it is shown that transversely rectangular electrodes 2a and 2c are symmetrically disposed through the line Zc while transversely rectangular electrodes 2d and 2f are symmetrically disposed through the line Zc. In FIG. 3C, it is shown that circular electrodes 2a and 2c are symmetrically disposed through the line Zc and circular electrodes 2d and 2f are symmetrically disposed through the line Zc while circular electrodes 2b and 2e are disposed on the line Zc. In FIG. 3D, the electrodes 2a to 2f are disposed with the interval between adjacent electrodes as shown in FIG. 3A narrowed. In FIG. 3E, vertically rectangular electrodes 2a and 2b are symmetrically disposed through the line Zc and vertically rectangular electrodes 2g and 2h are symmetrically disposed through the line Zc. In FIG. 3F, transversely rectangular electrodes 2a and 2c are symmetrically disposed through the line Zc and transversely rectangular electrodes 2d and 2f are symmetrically disposed through the line Zc while a vertically rectangular electrode 2i is disposed on the line Zc. In FIG. 3G, transversely rectangular electrodes 2a and 2c are symmetrically disposed through the line Zc and transversely rectangular electrodes 2d and 2f are symmetrically disposed through the line Zc while a cross-shaped electrode 2j is disposed on the lines Zc and Xc. In FIG. 3H, square electrodes 2a and 2c are asymmetrically disposed with regard to the line Zc and square electrodes 2d and 2f are asymmetrically disposed thereto.

FIG. 4 is a sectional view of the optical transmission module with an optical device according to the present embodiment mounted therein to show one example of the production steps thereof.

Figure 4A:
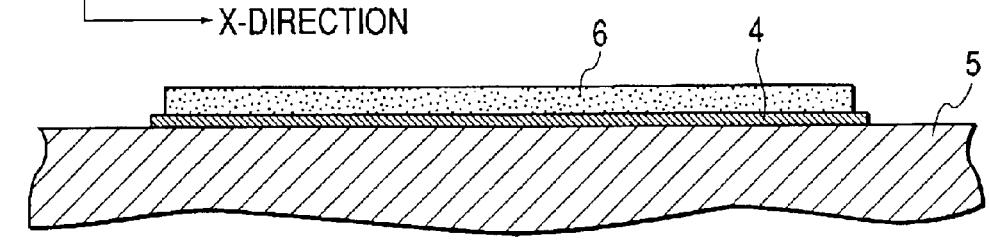
FIGS. 4A to 4D are sectional views of the optical transmission module with the optical device mounted in the substrate to explain the production process thereof.
Figure 4B:
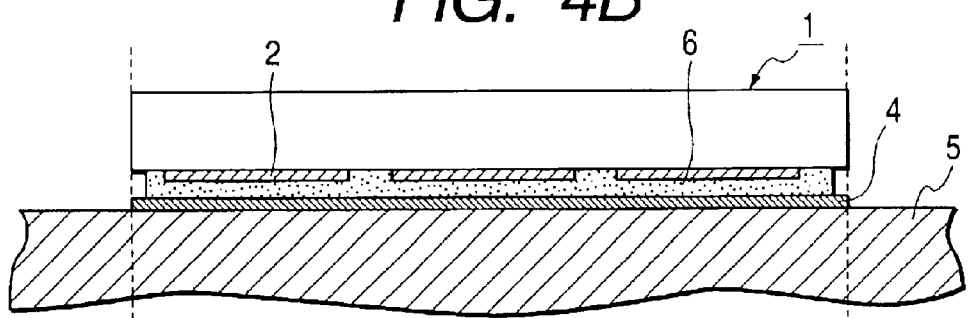

Firstly, as shown in FIG. 4A, solder 3 is supplied to a metallic electrode 4 on a substrate 5. The solder 3 may be supplied thereto by any one of vapor deposition, sputtering, plating and preform in the present embodiment. Then, as shown in FIG. 4B, an optical device 1 is two-dimensionally positioned to the substrate 5, and the solder 3 as supplied is heated under the temperature below the melting point thereof so as to turn into a softened solder 6, which solder is pressurized for the temporary connection of the device to the substrate. The oxide film in the soldered interface with the respective electrodes 2a to 2f of the optical device 1 is ruptured for a better fixity between the device and the substrate 5, which prevents them from being displaced relative to each other during the preliminary step of pre-positioning them and the subsequent step of fusing the solder for solidification so as to realize a mounting process thereof with higher precision and productivity.

Figure 4C:
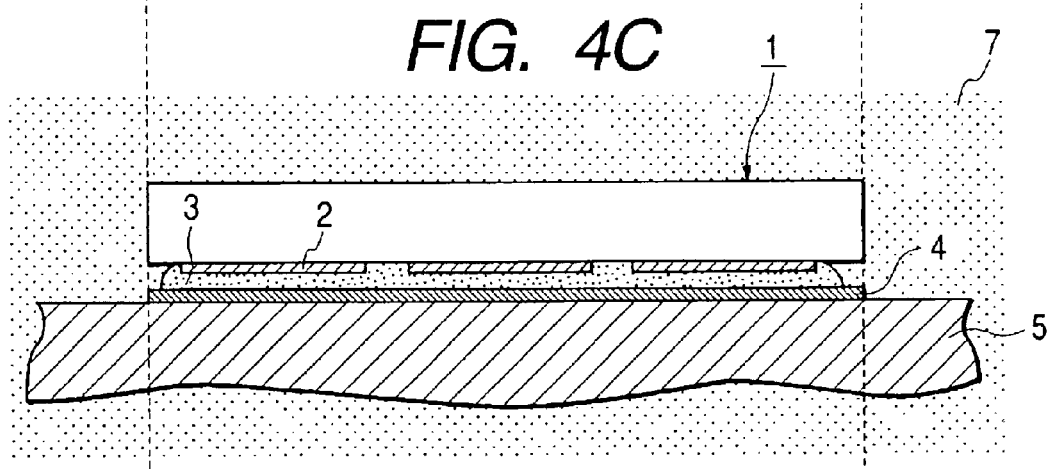
Figure 4D:
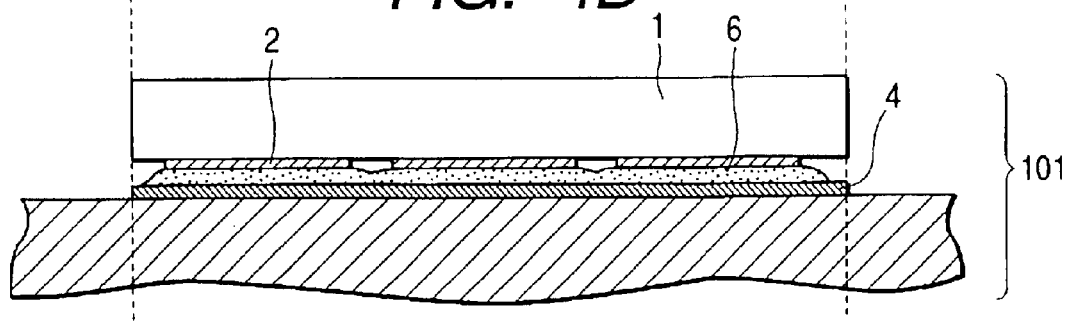

Then, as for the optical device 1 as two-dimensionally positioned with high precision under temporary connection with the substrate, in order to keep the optical device 1 mounted in the substrate both after and before soldering solidification, it is required that the solder be fused to all of the electrodes 2a to 2f thereof. In the present embodiment, the fusion of the solder under an antioxidant gas 7 as shown in FIG. 4C allows the electrodes 2a to 2f of the device 1 under such temporary connection to rupture the oxide film of the soldered surface so as to wet the solder to all of the electrodes 2a to 2f without re-oxidization, and the disposition of those electrodes is arranged such that the total bending moment as caused by the upward force of the fused solder amounts closer to zero, which enables an optical device 1 as mounted with higher horizontal and vertical precision to be realized after refrigeration.

Hereafter, the production method of the optical device according to the present invention is described.

FIGS. 5A to 5F are sectional views of the optical device to show one example of the production process thereof. In the present embodiment, the electrodes 2a to 2f of the device 1 are produced as described below, which drastically reduces the number of the production errors thereof so as to make the positions of the respective electrodes 2a to 2f with regard to the substrate substantially constant and to achieve the above conditions of |La–Lc| and |Ld–Lf| being less than or equal to 60 $\mu$m.

As shown, a wafer 20 comprises a first semiconductor layer 21, an active layer 22 formed on one side (hereinafter, referred to as 'an upper surface') of the first semiconductor layer 21, a second semiconductor layer 23 formed on the active layer 22 and an electrode 24 formed on the second semiconductor layer 23. In order to illuminate the optical device 1, it is required to apply voltage to the electrodes provided on both side surfaces of the optical device 1. The electrode 4 is formed on one of those surfaces.

Figure 5A:
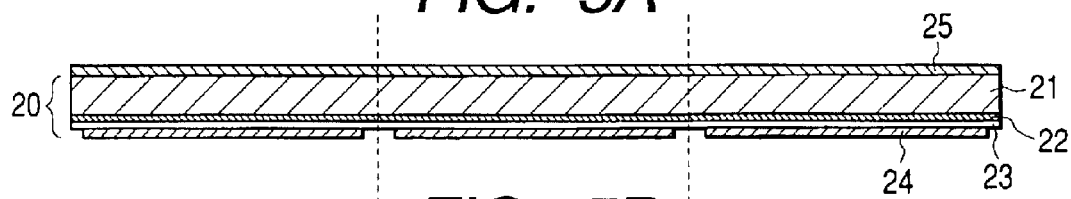
FIGS. 5A to 5F are sectional views of the optical device to explain one example of the production process thereof.

In FIG. 5A, it is shown that the other side opposite to that provided with the active layer 22 of the first semiconductor layer is polished so as to adjust the thickness of the wafer 20, on which wafer a resist material 25 is coated.

Figure 5B:
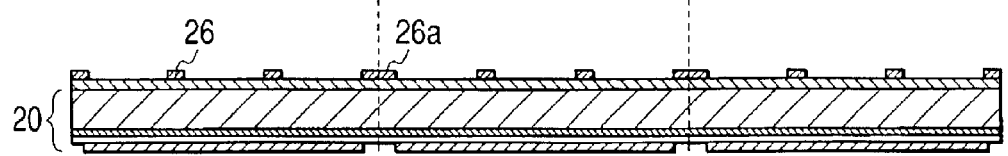
Figure 5C:
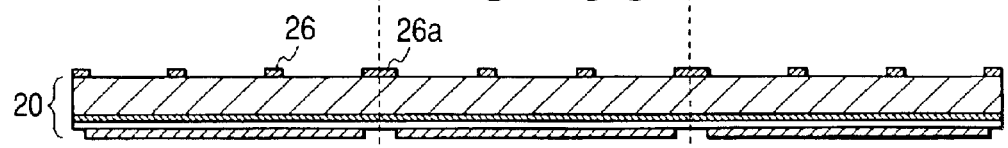

In FIGS. 5B and 5C, it is shown that after an electrodes forming mask 26 is positioned on the resist material 25, the resist material is exposed and cleansed so as to be left just on the portions thereof where the electrodes are not formed.

Figure 5D:
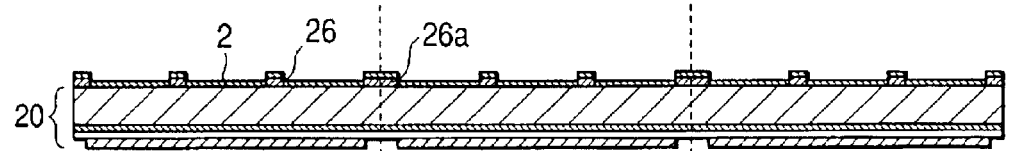
Figure 5E:
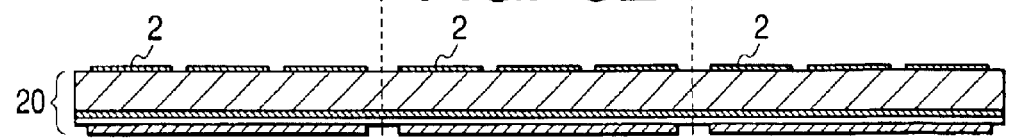
Figure 5F:
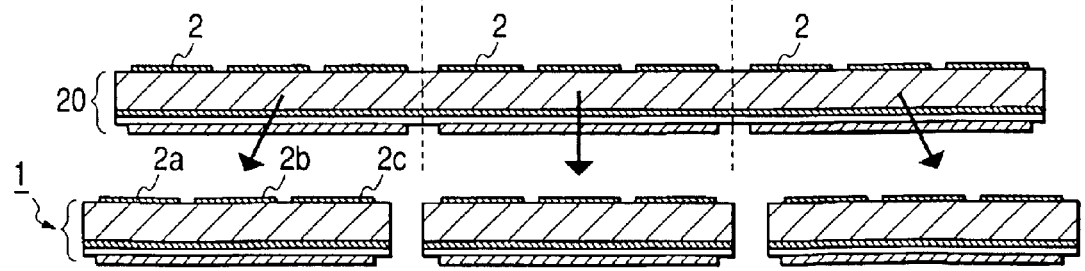

In FIG. 5D, it is shown that an electrode material to be soldered is overlaid on the resist material by vapor deposition to form metallic electrodes 2. Then, as shown in FIG. 5E, upon the removal of the resist material 25, a number of metallic electrodes 2 are formed. The provision of a resist material broader portion 25a on the wafer surface as provided with a number of electrodes 2, which portion is halved at the centerline thereof, allows the plurality of optical devices 1 to be produced. The respective optical devices as produced are provided with the electrodes 2a to 2f, though only those 2a to 2c are shown in the drawing.

According to the production method of the optical devices 1 in the present embodiment, the electrodes forming mask 26 is positioned on the resist material such that the electrodes 2a to 2f of the respective optical devices 1 as provided in the same wafer 20 are substantially identical to each other. In other words, the electrodes 2a to 2f of the respective optical devices are produced such that they are substantially the same in shape and disposed in substantially the same relative positions to each other.

FIG. 6A is a partly sectional view of one example of the optical transmission module according to the present invention while FIG. 6B is an upper surface view thereof. As shown in the drawings, in the present embodiment, the optical device 1 is mounted in an optical waveguide substrate 13 so as to form an optical transmission module. An optical waveguide 11 with a core layer 12 is attached to the substrate 13, to which substrate the optical device 1 is soldered such that the active layer 22 thereof corresponds to the core layer 12. In the present embodiment, it is arranged such that the electrodes 2a to 2f of the respective optical devices 1 are substantially the same in shape and disposed in substantially the same relative positions to each other so as to provide an optical transmission module as precisely positioned on a given location of the substrate 13. Further, the core layer 12 of the optical waveguide 11 aligns with the active layer 22 of the optical device 1 with high precision so as to realize a highly precise optical coupling between the optical device 1 and the waveguide 11.

FIG. 7A is a partly sectional view of one example of the optical transmission module according to the present invention while FIG. 7B is an upper surface view thereof. As shown therein, the difference between this example and that as shown in FIG. 6 lies in that a lens 14 interposes between the waveguide 11 and the optical device 1. Also in this example, the waveguide 11 aligns with the active layer 22 of the optical device 1 through the lens 14 with high precision so as to realize a better alignment between the optical device 1 and the waveguide 11.

As described above, the optical transmission module according to the present invention comprises an optical device provided with an active layer to emanate light and a plurality of electrodes, wherein the electrodes are symmetrically disposed through a centerline running parallel to an optical axis of the active layer and passing through a center of gravity of the optical device or through the optical axis, and a substrate provided with one electrode to be soldered to the plurality of electrodes, wherein the optical device is arranged such that the difference between the shortest distances from the center of gravity of the respective symmetrically disposed electrodes to the centerline or the optical axis amounts to 100 $\mu$m or less, which difference may preferably amount to 60 $\mu$m or less.

Further, the optical transmission module according to the present invention comprises an optical device provided with an active layer to emanate light and a plurality of electrodes, wherein the electrodes are symmetrically disposed through a centerline running parallel to an optical axis of the active layer and passing through a center of gravity of the optical device or through the optical axis, and a substrate provided with one electrode to be soldered to the plurality of electrodes, wherein the optical device is arranged such that the symmetrically disposed electrodes through the centerline or the optical axis have an error of 100 µm or less, which electrodes may preferably have an error of 60 µm or less.

Further, the optical transmission module according to the present invention is arranged such that the difference between the summation of the shortest distances from the center of gravity of the respective electrodes as disposed in a first side of the optical device as divided by the centerline or the optical axis to the centerline or the optical axis and that of the shortest distances from the center of gravity of the respective electrodes as disposed in a second side of the optical device as divided by the centerline or the optical axis to the centerline or the optical axis amounts to 50 µm multiplied by the number of electrodes or less, which difference may preferably amount to 30 µm multiplied by the number of electrodes or less.

The present invention improves the optical coupling efficiency between the waveguide and the optical device mounted in the optical transmission module so as to extend the transmission distance thereof.

The present invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes that come within the meaning and range of equivalency of the claims are therefore intended to be embraced therein.

What is claimed is:

1. An optical transmission module comprising:
    an optical device provided with an active layer to emanate light and a plurality of electrodes, said electrodes symmetrically disposed through a centerline passing through a center of gravity of said optical device and running parallel to an optical axis of said active layer; and
    a substrate provided with one electrode to be soldered to said plurality of electrodes,
    wherein said plurality of electrodes are disposed in said optical device such that a difference between shortest distances from said center of gravity of said respective electrodes symmetrically disposed through said centerline to said centerline amounts to 100 µm or less.

2. An optical transmission module comprising:
    an optical device provided with an active layer to emanate light and a plurality of electrodes, said electrodes symmetrically disposed through an optical axis of said active layer passing through a center of gravity of said optical device; and
    a substrate provided with one electrode to be soldered to said plurality of electrodes,
    wherein said plurality of electrodes are disposed in said optical device such that a difference between shortest distances from said center of gravity of said respective electrodes symmetrically disposed in each side of said optical device divided by said optical axis to said optical axis amounts to 100 µm or less.

3. An optical transmission module comprising:
    An optical device provided with an active layer to emanate light and a plurality of electrodes, the electrodes symmetrically disposed through a centerline passing through a center of gravity of the optical device and running parallel to an optical axis of the active layer;
    A substrate provided with one electrode to be soldered to the plurality of electrodes, where the plurality of electrodes are disposed in the optical device such that the electrodes symmetrically disposed through the centerline to the centerline have an error of 100 µm or less.

4. An optical transmission module comprising an optical device provided with an active layer to emanate light and a plurality of electrodes wherein said electrodes are symmetrically disposed through an optical axis of said active layer passing through a center of gravity of said optical device and a substrate provided with one electrode to be soldered to said plurality of electrodes wherein said plurality of electrodes symmetrically disposed through said optical axis have an error of 100 µm or less.

5. An optical transmission module according to claim 1 wherein said difference between said shortest distances from said center of gravity of said respective electrodes symmetrically disposed through said centerline to said centerline amounts to 60 µm or less.

6. An optical transmission module according to claim 2 wherein said difference between said shortest distances from said center of gravity of said respective electrodes symmetrically disposed in each side of said optical device divided by said optical axis to said optical axis amounts to 60 µm or less.

7. An optical transmission module according to claim 3 wherein said plurality of electrodes symmetrically disposed through said centerline have an error of 60 µm or less.

8. An optical transmission module according to claim 4 wherein said plurality of electrodes symmetrically disposed through said optical axis have an error of 60 µm or less.

9. An optical transmission module comprising:
    an optical device provided with an active layer to emanate light and a plurality of electrodes, said electrodes symmetrically disposed through a centerline passing through a center of gravity of said optical device and running parallel to an optical axis of said active layer; and
    a substrate provided with one electrode to be soldered to said plurality of electrodes,
    wherein said plurality of electrodes are disposed in said optical device such that a difference between summation of shortest distances from said center of gravity of said respective electrodes as disposed in a first side of said optical device divided by said centerline to said centerline and said summation of said shortest distances from said center of gravity of said respective electrodes as disposed in a second side of said optical device divided by said centerline to said centerline amounts to 50 µm multiplied by the number of electrodes or less.

10. An optical transmission module comprising:
    an optical device provided with an active layer to emanate light and a plurality of electrodes, said electrodes symmetrically disposed through an optical axis of said active layer passing through a center of gravity of said optical device; and
    a substrate provided with one electrode to be soldered to said plurality of electrodes,
    wherein said plurality of electrodes are disposed in said optical device such that a difference between summation of shortest distances from said center of gravity of said respective electrodes as disposed in a first side of said optical device divided by said optical axis to said optical axis and said summation of said shortest distances from said center of gravity of said respective electrodes as disposed in a second side of said optical device divided by said optical axis to said optical axis amounts to 50 µm multiplied by the number of electrodes or less.

11. An optical transmission module comprising:

an optical device provided with an active layer to emanate light and a plurality of electrodes, said electrodes symmetrically disposed through a centerline passing through a center of gravity of said optical device and running parallel to an optical axis of said active layer; and a substrate provided with one electrode to be soldered to said plurality of electrodes, wherein said plurality of electrodes are disposed in said optical device such that a difference between summation of shortest distances from said center of gravity of said respective electrodes as disposed in a first side of said optical device divided by said centerline to said centerline and said summation of said shortest distances from said center of gravity of said respective electrodes as disposed in a second side of said optical device divided by said centerline to said centerline amounts to an error of 50 $\mu$m multiplied by the number of electrodes or less.

12. An optical transmission module comprising:

an optical device provided with an active layer to emanate light and a plurality of electrodes, said electrodes symmetrically disposed through an optical axis of said active layer; and a substrate provided with one electrode to be soldered to said plurality of electrodes, wherein said plurality of electrodes are disposed in said optical device such that a difference between summation of shortest distances from said center of gravity of said respective electrodes as disposed in a first side of said optical device divided by said optical axis to said optical axis and said summation of said shortest distances from said center of gravity of said respective electrodes as disposed in a second side of said optical device divided by said optical axis to said optical axis amounts to an error of 50 $\mu$m multiplied by the number of electrodes or less.

13. An optical transmission module according to claim 9 wherein said plurality of electrodes are disposed in said optical device such that said difference between summation of shortest distances amounts to 30 $\mu$m multiplied by the number of electrodes or less.

14. An optical transmission module according to claim 10 wherein said plurality of electrodes are disposed in said optical device such that said difference amounts to 30 $\mu$m multiplied by the number of electrodes or less.

* * * * *